(12) United States Patent
Holmes et al.

(10) Patent No.: US 9,239,367 B2
(45) Date of Patent: Jan. 19, 2016

(54) INTRA-BLADE FILTER FOR MOTION CORRECTED MAGNETIC RESONANCE DATA

(75) Inventors: James Hartman Holmes, Cambridge, WI (US); Philip James Beatty, Toronto (CA)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 688 days.

(21) Appl. No.: 13/619,110

(22) Filed: Sep. 14, 2012

(65) Prior Publication Data

US 2014/0077813 A1  Mar. 20, 2014

(51) Int. Cl.
| | |
|---|---|
| G01R 33/341 | (2006.01) |
| G06K 9/00 | (2006.01) |
| G01R 33/56 | (2006.01) |
| G01R 33/48 | (2006.01) |
| G01R 33/565 | (2006.01) |

(52) U.S. Cl.
CPC ........ G01R 33/5602 (2013.01); G01R 33/4824 (2013.01); *G01R 33/56509* (2013.01)

(58) Field of Classification Search
CPC ........... G01R 33/4824; G01R 33/5611; G01R 33/56509; G01R 33/5602; G01R 33/561
USPC ........................... 324/307–309; 382/131, 132
See application file for complete search history.

(56) References Cited

U.S. PATENT DOCUMENTS

| | | | |
|---|---|---|---|
| 7,282,917 B1 | 10/2007 | Brau et al. | |
| 7,439,739 B2 | 10/2008 | Beatty | |
| 7,486,075 B2 | 2/2009 | Brau et al. | |
| 7,492,153 B2 | 2/2009 | Brau et al. | |
| 7,508,212 B2 | 3/2009 | Fain et al. | |
| 7,619,410 B2 | 11/2009 | Beatty et al. | |
| 7,688,068 B2 | 3/2010 | Beatty | |
| 7,692,425 B2 | 4/2010 | Brau et al. | |
| 7,714,581 B2 | 5/2010 | Erickson et al. | |
| 7,768,264 B1 | 8/2010 | Brau et al. | |
| 7,994,785 B2 | 8/2011 | Fain et al. | |
| 8,076,938 B2 | 12/2011 | Brau et al. | |
| 8,116,541 B2 | 2/2012 | Brau et al. | |
| 8,175,359 B2 | 5/2012 | O'Halloran et al. | |
| 8,587,306 B2 | 11/2013 | Takizawa | |
| 2010/0013475 A1* | 1/2010 | Kimura | 324/307 |
| 2011/0175613 A1* | 7/2011 | Shigeta et al. | 324/309 |
| 2012/0262172 A1* | 10/2012 | Holmes et al. | 324/309 |
| 2014/0043024 A1* | 2/2014 | Gui et al. | 324/309 |

OTHER PUBLICATIONS

Pipe, James G. "Motion Correction With Propeller MRI: Application to Head Motion and Free-Breathing Cardiac Imaging." Magnetic Resonance in Medicine 42 (1999): 963-969.*

(Continued)

*Primary Examiner* — Melissa Koval
*Assistant Examiner* — Rishi Patel
(74) *Attorney, Agent, or Firm* — Fletcher Yoder, P.C.

(57) ABSTRACT

In an embodiment, a method includes processing magnetic resonance (MR) data according to a process including applying a density filter to blades of k-space data rotated about a section of k-space. Each blade may include a first set of encode lines weighted in a first signal weighting and a second set of encode lines weighted in a second signal weighting. The density filter may be configured to preferentially weight each blade in the first signal weighting to produce blades of weighted k-space data.

16 Claims, 5 Drawing Sheets

(56) References Cited

OTHER PUBLICATIONS

Alkan, Özlem, et al. "Comparison of contrast-enhanced T1-weighted FLAIR with Blade and spin-echo T1-weighted sequences in intracranial MRI." Diagn Interv Radiol 15.2 (2009): 75-80.*

Barger et al., Time-Resolved Contrast-Enhanced Imaging With Isotropic Resolution and Broad Coverage Using an Undersampled 3D Projection Trajectory, Magnetic Resonance in Medicine (2002) 48:297-305.

Holmes et al., Measurements of Hyperpolarized He-3 T2* and ADC in the lungs Using Multi-echo VIPR, Proc. Intl. Soc. Mag. Reson. Med. 15 (2007) 1289.

Song et al., k-Space Weighted Image Contrast (KWIC) for Contrast Manipulation in Projection Reconstruction MRI, Magnetic Resonance in Medicine (2000) 44:825-832.

Song et al., Dynamic MRI with Projection Reconstruction and KWIC Processing for Simultaneous High Spatial and Temporal Resolution, Magnetic Resonance in medicine (2004) 52:815-824.

\* cited by examiner

INTRA-BLADE FILTER FOR MOTION CORRECTED MAGNETIC RESONANCE DATA

BACKGROUND OF THE INVENTION

In general, magnetic resonance imaging (MRI) examinations are based on the interactions among a primary magnetic field, a radiofrequency (RF) magnetic field, and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

The magnetic fields used to generate images in MRI systems include a highly uniform, static magnetic field that is produced by a primary magnet. A series of gradient fields are produced by a set of gradient coils located around the subject. The gradient fields encode positions of individual plane or volume elements (pixels or voxels) in two or three dimensions. An RF coil is employed to produce an RF magnetic field. This RF magnetic field perturbs the spins of some of the gyromagnetic nuclei from their equilibrium directions, causing the spins to precess around the axis of their equilibrium magnetization. During this precession, RF fields are emitted by the spinning, precessing nuclei and are detected by either the same transmitting RF coil, or by a separate coil. These signals are amplified, filtered, and digitized. The digitized signals are then processed using one or more algorithms to reconstruct a useful image.

Techniques have been developed to perform MRI imaging sequences to correct for patient motion, such as to avoid long breath holds required of patients and to correct for voluntary/involuntary patient/tissue movement. However, current techniques for such correction are often inadequate or subject to further improvement. For example, some techniques for motion correction may not enable certain types of imaging, such as T1-weighed MR imaging, to be performed. Accordingly, it is now recognized that a need exists for improved methods for data acquisition and reconstruction in magnetic resonance imaging techniques that are able to correct for patient motion.

BRIEF DESCRIPTION OF THE INVENTION

Certain embodiments commensurate in scope with the originally claimed invention are summarized below. These embodiments are not intended to limit the scope of the claimed invention, but rather these embodiments are intended to provide a brief summary of possible forms of the invention. Indeed, the invention may encompass a variety of forms that may be similar to or different from the embodiments set forth below.

In an embodiment, a method includes processing magnetic resonance (MR) data according to a process including applying a density filter to blades of k-space data rotated about a section of k-space. Each blade may include a first set of encode lines weighted in a first signal weighting and a second set of encode lines weighted in a second signal weighting. The density filter may be configured to preferentially weight each blade in the first signal weighting to produce blades of weighted k-space data.

In another embodiment, a method includes processing magnetic resonance (MR) data according to a process including correcting blades of filtered k-space data rotated about a section of k-space for motion, the blades of filtered k-space data having first data that is preferentially weighted with respect to second data. The method also includes correcting the blades of filtered k-space data for motion includes applying one or more motion correction parameters obtained from performing a motion correction algorithm on blades of k-space data corresponding to the blades of filtered k-space data.

In a further embodiment, a magnetic resonance imaging (MRI) system includes a primary field magnet configured to place gyromagnetic nuclei within a patient into an equilibrium magnetization, a plurality of gradient field coils configured to encode positional information into the gyromagnetic nuclei, a radiofrequency (RF) transmit coil configured to perturb the gyromagnetic nuclei away from their equilibrium magnetization, a plurality of RF receiving coils configured to receive MR signals from the gyromagnetic nuclei as they relax to their equilibrium magnetization, and control circuitry coupled to the gradient field coils, to the RF transmit coil, and to the plurality of RF receiving coils. The control circuitry is configured to apply control signals to the gradient, RF transmit or receiving coils, or any combination thereof, to acquire blades of k-space data representative of gyromagnetic material within a subject of interest. The blades are rotated about a section of k-space compared to every other blade and each blade includes a first set of encode lines weighted in a first signal weighting and a second set of encode lines weighted in a second signal weighting. The MRI system also includes reconstruction circuitry configured to process the blades of k-space data by: applying a filter to the blades of k-space data to preferentially weight each blade in the first signal weighting to produce blades of filtered k-space data; and applying one or more motion correction parameters to the blades of filtered k-space data to correct the blades of filtered k-space data for motion. The one or more motion correction parameters are obtained from performing a motion correction algorithm on the blades of k-space data.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
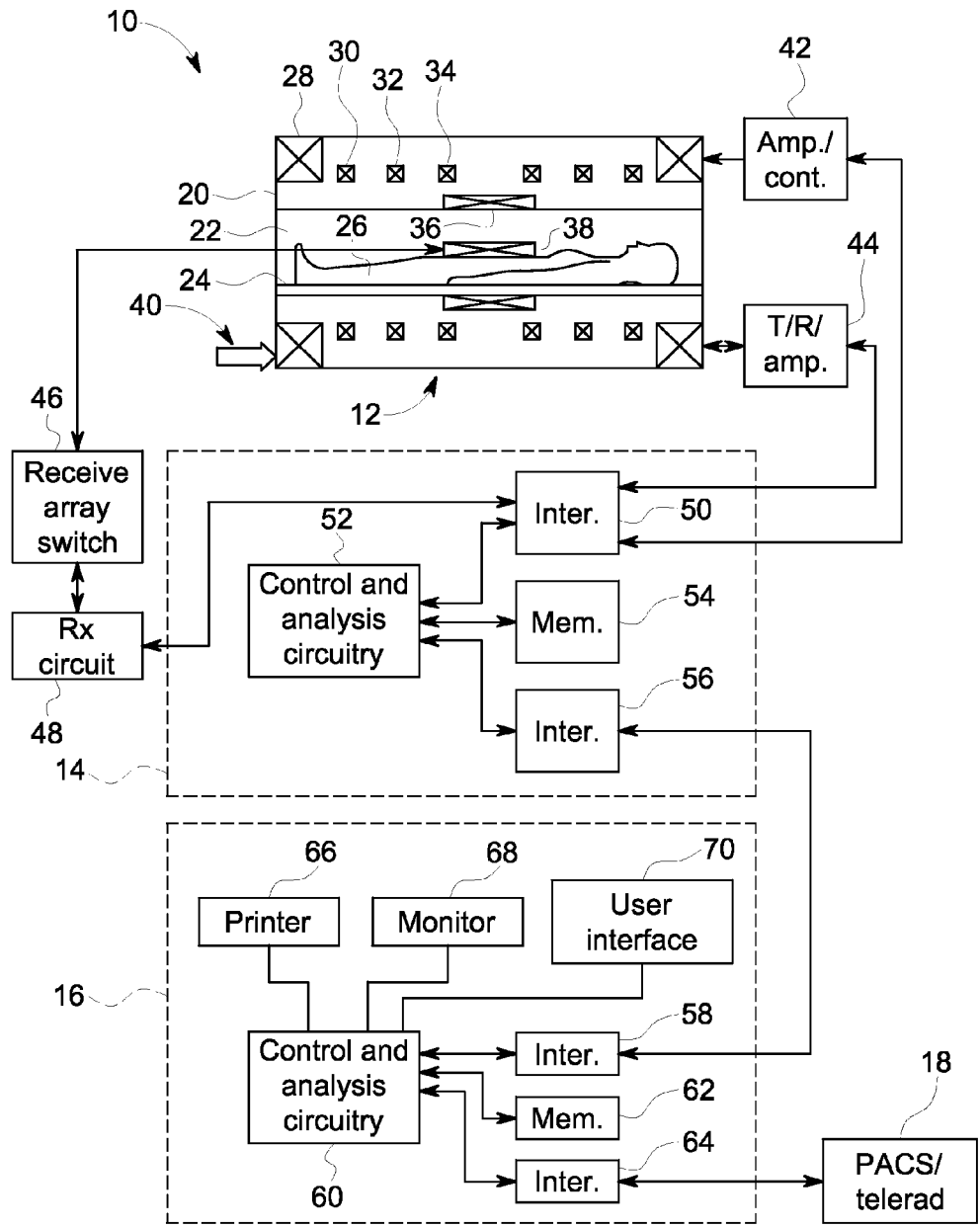
FIG. 1 is a diagrammatical representation of an embodiment of a magnetic resonance imaging (MRI) system configured to obtain and process magnetic resonance (MR) data in a manner that enables motion correction, in accordance with an aspect of the present disclosure.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As noted above, certain techniques have been developed to perform MRI imaging sequences to correct for patient motion, such as to avoid long breath holds required of patients and to correct for voluntary/involuntary patient/tissue movement. For example, certain non-Cartesian acquisitions, such as fast spin echo (FSE) periodically rotated overlapping parallel lines with enhanced reconstruction (PROPELLER) acquisitions, may be effective for obtaining T2-weighted images, particularly in situations where there is some degree of patient movement (e.g., due to involuntary/voluntary movement and/or pulsatile tissue). Generally, PROPELLER acquisitions include trajectories wherein groups of lines, i.e., blades, of k-space are filled. As discussed herein, the "blades" may have any shape suitable for PROPELLER reconstruction, including circular, semi-circular, ellipsoidal, rectangular, or other shapes. In some embodiments, motion correction is enhanced when wider blades are acquired. By way of non-limiting example, blades may be measured by the number of encode lines used to fill each blade, and a "wide" blade may be a blade having greater than 15 encode lines. In an FSE sequence, each echo in an echo train is used to fill one encode line. Thus, FSE PROPELLER acquisitions are typically associated with long echo train lengths (ETLs) (e.g., greater than 15) to enable wide blade acquisition and, therefore, robust motion correction.

Unfortunately, the short echo times (TE) and short ETLs used to generate T1 or proton density (PD)-weighted acquisitions typically limit blade width, which can be counterproductive for motion correction. In addition, because T1-weighted and PD-weighted acquisitions lead to narrow blade widths, more blades may be acquired compared to long ETL FSE acquisitions in order to fill k-space with a sufficient amount of data to generate a useful image. Again, this generally limits the ability of the PROPELLER algorithm to correct for patient motion. Accordingly, a need exists for methods that enable the generation of T1 and/or PD-weighted images while also enabling robust motion correction.

The present embodiments address these and other shortcomings of existing methods for acquisition and image reconstruction by providing approaches for tailoring image contrast of PROPELLER acquisitions by altering the weighting of oversampled data. In accordance with certain embodiments, the weighting scheme may preferentially emphasize data having a desired weighting. For example, a weighting scheme in accordance with present embodiments may preferentially emphasize T1-weighted or PD-weighted data acquired during a relatively long ETL (e.g., 15 or more), rather than the T2-weighted data that would be emphasized using a weighting scheme designed for enhancing signal-to-noise. In other words, the present approaches include embodiments in which weighting schemes preferentially weight data based on contrast, rather than signal-to-noise. Thus, it should be noted that there is delicate balance between a desired contrast and ultimate signal-to-noise of the acquired data when longer ETLs are acquired. As discussed in further detail below, such a balance may be achieved through the use of a filter configured to preferentially weight (e.g., give a higher weight to) data acquired at the beginning (e.g., from echoes toward the beginning) of a given echo train versus data acquired during later echoes. In one embodiment, the filter may be a bowtie-shaped density filter.

As noted above, the embodiments described herein may be performed by a magnetic resonance imaging (MRI) system, wherein specific imaging routines (e.g., PROPELLER MRI sequences) are initiated by a user (e.g., a radiologist). Thus, the MRI system may perform data acquisition, data construction, and image synthesis. Accordingly, referring to FIG. 1, a magnetic resonance imaging system 10 is illustrated schematically as including a scanner 12, scanner control circuitry 14, and system control circuitry 16. According to the embodiments described herein, the MRI system 10 is generally configured to perform MR imaging, such as imaging sequences for motion correction, T1, T2, proton density (PD) weighting, fluid attenuation, perfusion, and so on. System 10 additionally includes remote access and storage systems or devices such as picture archiving and communication systems (PACS) 18, or other devices such as teleradiology equipment so that data acquired by the system 10 may be accessed on- or off-site. In this way, MR data may be acquired, followed by on- or off-site processing and evaluation. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient.

Scanner 12 includes a series of associated coils for producing controlled magnetic fields for exciting the gyromagnetic material within the anatomy of the subject being imaged. Specifically, a primary magnet coil 28 is provided for generating a primary magnetic field generally aligned with the bore 22. A series of gradient coils 30, 32, and 34 permit controlled magnetic gradient fields to be generated for positional encoding of certain of the gyromagnetic nuclei within the patient 26 during examination sequences. A radio frequency (RF) coil 36 is provided, and is configured to generate radio frequency pulses for exciting the certain gyromagnetic nuclei within the patient. In addition to the coils that may be local to the scanner 12, the system 10 also includes a set of receiving coils 38 (e.g., an array of coils) configured for placement proximal (e.g., against) the patient 26. The receiving coils 38 may have any geometry, including both enclosed and single-sided geometries. As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state. The receiving coils 38 may be switched off so as not to receive or resonate with the transmit pulses generated by the scanner coils, and may be switched on so as to receive or resonate with the RF signals generated by the relaxing gyromagnetic nuclei.

The various coils of system 10 are controlled by external circuitry to generate the desired field and pulses, and to read emissions from the gyromagnetic material in a controlled manner. In the illustrated embodiment, a main power supply 40 provides power to the primary field coil 28. A driver circuit 42 is provided for pulsing the gradient field coils 30, 32, and 34. Such a circuit may include amplification and control circuitry for supplying current to the coils as defined by digitized pulse sequences output by the scanner control circuit 14. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry for generating the RF pulses. Similarly, the receiving coils 38 are connected to switch 46 that is capable of switching the receiving coils 38 between receiving and non-receiving modes. Thus, the receiving coils 38 resonate with the RF signals produced by relaxing gyromagnetic nuclei from within the patient 26 while in the receiving mode, and they do not resonate with RF energy from the transmitting coils (i.e., coil 36) so as to prevent undesirable operation while in the non-receiving mode. Additionally, a receiving circuit 48 is provided for receiving the data detected by the receiving coils 38, and may include one or more multiplexing and/or amplification circuits.

It should be noted that while the scanner 12 and the control/amplification circuitry described above are illustrated as being coupled by a single line, that many such lines may occur in an actual instantiation. For example, separate lines may be used for control, data communication, and so on. Further, suitable hardware may be disposed along each type of line for the proper handling of the data. Indeed, various filters, digitizers, and processors may be disposed between the scanner and either or both of the scanner and system control circuitry 14, 16. By way of non-limiting example, certain of the control and analysis circuitry described in detail below, although illustrated as a single unit, includes additional hardware such as image reconstruction hardware configured to perform the data filtering, motion correction, and image reconstruction techniques described herein.

As illustrated, scanner control circuit 14 includes an interface circuit 50, which outputs signals for driving the gradient field coils and the RF coil and for receiving the data representative of the magnetic resonance signals produced in examination sequences. The interface circuit 50 is coupled to a control and analysis circuit 52. The control and analysis circuit 52 executes the commands for driving the circuit 42 and circuit 44 based on defined protocols selected via system control circuit 16. Control and analysis circuit 52 also serves to receive the magnetic resonance signals and performs subsequent processing before transmitting the data to system control circuit 16. Scanner control circuit 14 also includes one or more memory circuits 54, which store configuration parameters, pulse sequence descriptions, examination results, and so forth, during operation. Interface circuit 56 is coupled to the control and analysis circuit 52 for exchanging data between scanner control circuit 14 and system control circuit 16. Such data will typically include selection of specific examination sequences to be performed, configuration parameters of these sequences, and acquired data, which may be transmitted in raw or processed form from scanner control circuit 14 for subsequent processing, storage, transmission and display. Therefore, in certain embodiments, the control and analysis circuit 52, while illustrated as a single unit, may include one or more hardware devices.

System control circuit 16 includes an interface circuit 58, which receives data from the scanner control circuit 14 and transmits data and commands back to the scanner control circuit 14. The interface circuit 58 is coupled to a control and analysis circuit 60 which may include a CPU in a multi-purpose or application specific computer or workstation. Control and analysis circuit 60 is coupled to a memory circuit 62 to store programming code for operation of the MRI system 10 and to store the processed image data for later reconstruction, display and transmission. The programming code may execute one or more algorithms capable of performing, by way of example, non-Cartesian imaging sequences and processing (e.g., filtering and reconstruction) of sampled image data (e.g., blades of data, undersampled data), which will be discussed in detail below. An additional interface circuit 64 may be provided for exchanging image data, configuration parameters, and so forth with external system components such as remote access and storage devices 18. Finally, the system control and analysis circuit 60 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

Scanner 12 and the control and analysis circuit 52 associated therewith produce magnetic fields and radio frequency pulses in a controlled manner to excite and encode specific gyromagnetic material within the patient 26. The scanner 12 and control and analysis circuit 52 also sense the signals emanating from such material and create an image of the material being scanned. In certain embodiments, the scan may be a scan resulting in an array of geometries (e.g., blades) of k-space data that are rotated with respect to one another about a region of k-space (e.g., the center of k-space). It should be noted that the MRI system described is merely intended to be exemplary only, and other system types, such as so-called "open" MRI systems may also be used. Similarly, such systems may be rated by the strength of their primary magnet, and any suitably rated system capable of carrying out the data acquisition and processing described below may be employed.

Specifically, aspects of the present disclosure include methods for acquiring magnetic resonance data and processing of such data to construct a motion-corrected image, including T1-weighted images, T1-weighted images with fluid attenuation, and the like. At least a portion of the disclosed methods may be performed by the system 10 described above with respect to FIG. 1. That is, the MRI system 10 may perform the acquisition techniques described herein, and, in some embodiments, the data processing techniques described herein. It should be noted that subsequent to the acquisitions described herein, the system 10 may simply store the acquired data for later access locally and/or remotely, for example in a memory circuit (e.g., memory 62). Thus, when accessed locally and/or remotely, the acquired data may be manipulated by one or more processors contained within an application-specific or general purpose computer. The one or more processors may access the acquired data and execute routines stored on one or more non-transitory, machine readable media collectively storing instructions for performing methods including the image processing and reconstruction methods described herein.

Figure 2:
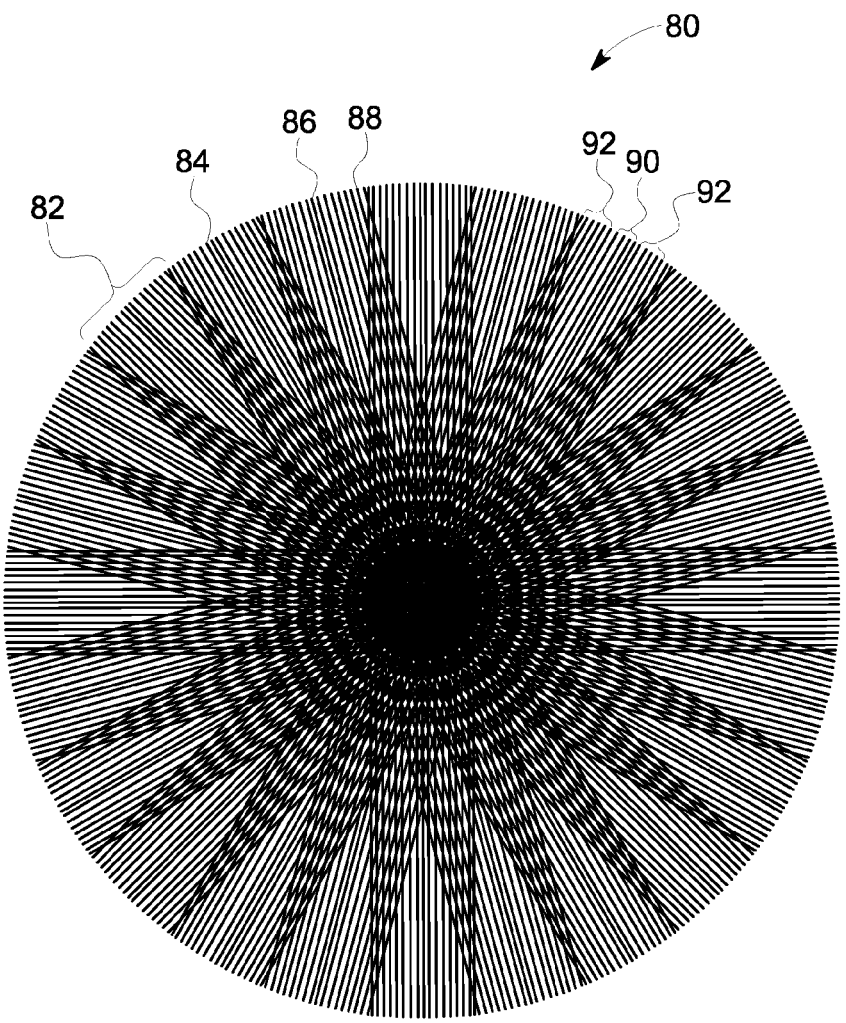
FIG. 2 is a diagrammatical representation of an embodiment of a non-Cartesian acquisition trajectory that may be obtained by the system of FIG. 1, in accordance with an aspect of the present disclosure.

As noted above, the present embodiments provide methods for performing acquisitions intended to enable motion correction, such as PROPELLER acquisitions, and for processing the acquired data to obtain an image having a desired contrast. As generally discussed above, PROPELLER acquisitions may be non-Cartesian acquisitions, where blades (e.g., sections) of k-space data are acquired and each blade is rotated about an area (e.g., the center) of k-space with respect to every other blade. One such embodiment of a PROPELLER trajectory 80 in k-space is depicted in FIG. 2.

In particular, the trajectory 80 includes a plurality of blades 82 rotated about the center of k-space. Each blade 82 includes a plurality of encode lines 84, with each of the encode lines 84 being filled upon receipt of an echo in an echo train during acquisition. Generally, the number of encode lines 84 within each blade 82 will equal the echo train length (ETL) of the particular acquisition utilized, and the ETL may be sufficiently long so as to enable motion correction using the PROPELLER algorithm. However, it is also presently contemplated that more than one echo train may be utilized to obtain each of the blades 82. In other words, one or more excitations may be utilized to obtain the data within each of the blades 82.

The data contained within each of the blades 82, upon acquisition, may have any preferential weighting, such as T1 weighting, T2 weighting, PD weighting, or any combination thereof. As may be appreciated, the preferential weighting of the encode lines 84 within each of the blades 82 may depend on the particular method utilized for acquiring the data. For example, the overall weighting of each of the blades 82 may depend at least on the ETL used to fill each of the blades 82, with longer ETL's favoring T2 weighted data. However, in certain embodiments, each of the encode lines 84 may have a different weighting that contributes to the overall weighting of their respective blade 84. For example, one of the blades 82 may include a first encode line 86 and a second encode line 88. The first and second encode lines 86, 88 may have generally the same signal weighting, or their weighting may be different depending on the manner in which the first and second encode lines 86, 88 are filled.

By way of non-limiting example, in a centric encoding scheme (encoding beginning with the encode line intersecting the k=0 point, the center of k-space), the first encode line 86 may be filled using a first echo in an echo train, and the second encode line 88 may be filled using a second echo in the echo train, with the first echo being received before the second. In such an embodiment, the first encode line 86 may be more preferentially weighted in T1 than the second encode line 88. Indeed, in certain embodiments, the second encode line 88 may be collected toward the end of the echo train and may have preferential T2 weighting, rather than preferential T1 weighting.

The blades 82 disclosed herein may be acquired using any technique, including spin echo techniques, fast spin echo techniques, gradient echo techniques, spoiled gradient echo techniques, and so on. In certain embodiments, a fast spin echo (FSE) sequence may be desirable so as to provide a desired contrast level compared to other techniques such as gradient echo techniques. Unfortunately, as noted above, FSE sequences for PROPELLER acquisitions can be time consuming due to the relatively large number of encode lines in each blade suitable for robust motion correction. For example, each of the blades 82 may include at least 20, at least 25, at least 30, or at least 35 encode lines. Accordingly, while in certain embodiments the entirety of each of the blades 82 may be acquired using FSE techniques (or any other technique), in other embodiments a combination of techniques may be used. For example, in one embodiment, one or more of the blades 82 may be acquired using an FSE sequence to acquire a first set of encode lines 90 (e.g., the first 5 or 10 encode lines), and the remaining encode lines (e.g., a second set of encode lines 92) may be acquired using a gradient echo sequence. Such an acquisition may be desirable to provide the enhanced contrast obtained using FSE sequences, while also providing the enhanced speed of gradient echo sequences to increase blade width. In some embodiments, the first set of encode lines may include redundantly sampled data, and may also be sampled in a way so as to satisfy the Nyquist criterion.

As discussed in detail below, the density filters discussed herein may enable the preferential weighting of the data acquired using the FSE sequence (i.e., to preferentially weight the first set of encode lines) so as to provide preferential T1 weighting of each of the blades 82. Again, this may result in a reconstructed image having contrast resulting from the preferentially weighted data (e.g., the T1-weighted data) and motion correction resulting from the entirety of the data in the blades 82. One embodiment of such a density filter 100 is depicted in FIG. 3.

Figure 3:
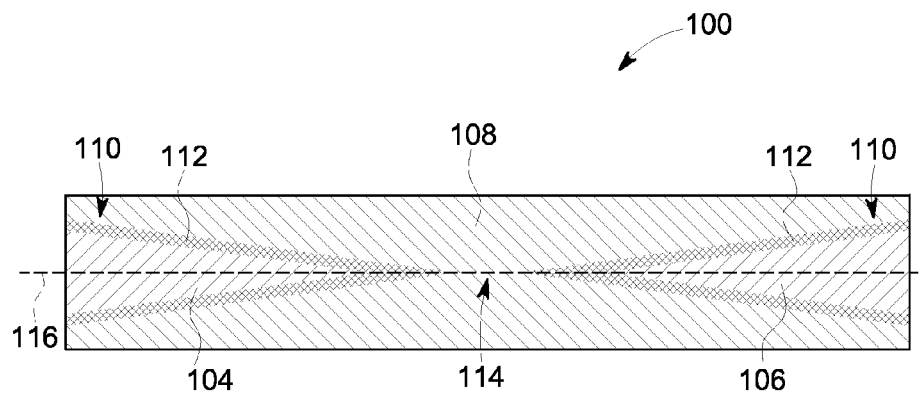
FIG. 3 is an illustration of an embodiment of a density filter configured to preferentially weight each blade of k-space data in the trajectory of FIG. 2 in signal acquired toward the center of k-space, in accordance with an aspect of the present disclosure.

While any density filter capable of performing the contrast adjustments described herein is presently contemplated, the density filter 100 of FIG. 3 is a bowtie-shaped filter configured to preferentially weight T1 weighted or PD weighted data contained within each of the blades 82 (FIG. 2). In other words, the density filter 100 may be a contrast-optimized filter configured to minimize or otherwise reduce the effective ETL of each of the blades 82. For example, in the embodiment noted above where the first set of encode lines 90 is acquired using an FSE sequence while the second set of encode lines 92 is acquired using a gradient echo sequence, the density filter 100 may adjust the data weighting of that particular blade such that an image produced therefrom may have a contrast substantially equal to a contrast that would be obtained if the blade had been obtained using only the FSE acquired data (i.e., using substantially only data contained within the first set of encode lines 90). For example, each of the blades 82 may have at least 25 encode lines, and the density filter 10 may cause the effective ETL of each of the blades 82, for purposes of image contrast, to be approximately equal to a blade having an ETL of no more than 4, 5, 6, 7, 8, 9, or 10 encode lines. Indeed, in a general sense, the effective ETL of each of the blades 82 may be reduced by at least approximately 50%, by at least approximately 60%, or by at least approximately 75%.

It will be appreciated with reference to the various patterns depicted in the density filter 100 that the density filter 100 generally includes first and second weighting regions 104, 106, which generally apply a substantially equal weight to the data to which they are applied (e.g., first data contained within the first set of encode lines 90 of FIG. 2). In one embodiment, the first and second weighting regions 104, 106 apply a relatively large weight (e.g., approximately 1) to the data to which they are applied (e.g., first data contained within the first set of encode lines 90 of FIG. 2) so as to preferentially weight a given blade (e.g., blade 82) in the signal weighting of the first data (e.g., a first signal weighting such as T1 and/or PD weighting). It will also be appreciated with reference to FIG. 3 that the density filter 100 includes a third weighting region 108, which in one embodiment applies a relatively small weight (e.g., approximately 0) to the data to which it is applied (e.g., second data contained within the second set of encode lines 92 of FIG. 2) so as to suppress or minimize the signal weighting of the second data (e.g., a second signal weighting such as T2 and/or T2* weighting) in the blade 82. Therefore, the density filter 100 may be considered to preferentially weight a blade to which it is applied in the first signal weighting (e.g., T1, PD). Indeed, in an embodiment where a blade is acquired first using an FSE sequence and then by a gradient echo sequence, the density filter 100 may be applied to the blade to change the blade as if the blade were acquired using only the FSE sequence.

It should be noted that there is also a transition region 112 between each of the first and second weighting regions 104, 106, and the third weighting region 108. In the transition region 112, data is given increasing weight relative to its position proximate to the first and second weighting regions 104, 106. In other words, the transition region 112 is a graded weighting region. For example, in portions of the transition region 112 closer to the third weighting region 108 than the first or second weighting regions 104, 106, the weighting provided by the transition region may be closer to 0, while portions of the transition region 112 closer to the first or second weighting regions 104, 106 than the third weighting region 108 may weight data with a weighting closer to 1. It should be appreciated that such weighting factors (e.g., approximately 1, approximately 0, between approximately 0 and 1) are merely used to facilitate description. Indeed, any weightings following the relative scheme depicted in FIG. 3 are presently contemplated. It should also be noted that, in certain embodiments, there may be no transition region 112.

As depicted, the first and second weighting regions 104, 106 together form a bow-tie structure, and each include a broad region 110 disposed toward the ends of the density filter 100, which corresponds to the position of data disposed radially distant from the center of k-space. The first and second weighting regions 104, 106 converge toward a center 114 of the density filter 100, which may correspond to the approximate center of k-space. In addition, the first and second weighting regions 104, 106 are generally bisected by a line 116 running through the center of the blade to which it is applied and through the center of k-space. In this way, the density filter 100 applies preferential weighting to data disposed along encode lines either intersecting k=0 (the center of k-space) or positioned proximate to such an encode line.

Again, in accordance with the embodiment illustrated in FIG. 3, the density filter 100 applies higher weighting to encode lines that pass through regions positioned closer to the center of k-space (e.g., encode lines acquired at the beginning of an echo train of a centric encoding FSE sequence), and reduces or minimizes weighting applied to encode lines that are acquired later during the echo train (i.e., positioned further away from k=0). A graphical depiction of such weighting is provided in FIGS. 4 and 5, which depict a plot 120 of cross-sectional weighting 122 for an encode line from an earlier acquired echo as a function of position 124 along k-space and a plot 126 of cross-sectional weighting 122 for a later acquired echo as a function of position 124 along k-space, respectively.

Figure 4:
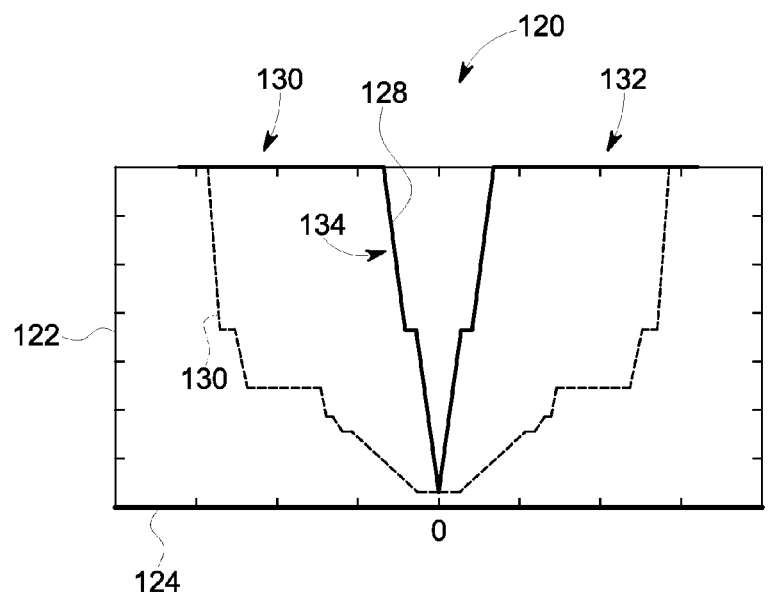
FIG. 4 is a plot of an embodiment of cross-sectional weighting applied by the filter of FIG. 3 to a first encode line as a function of position along the phase encode direction, in accordance with an aspect of the present disclosure.
Figure 5:
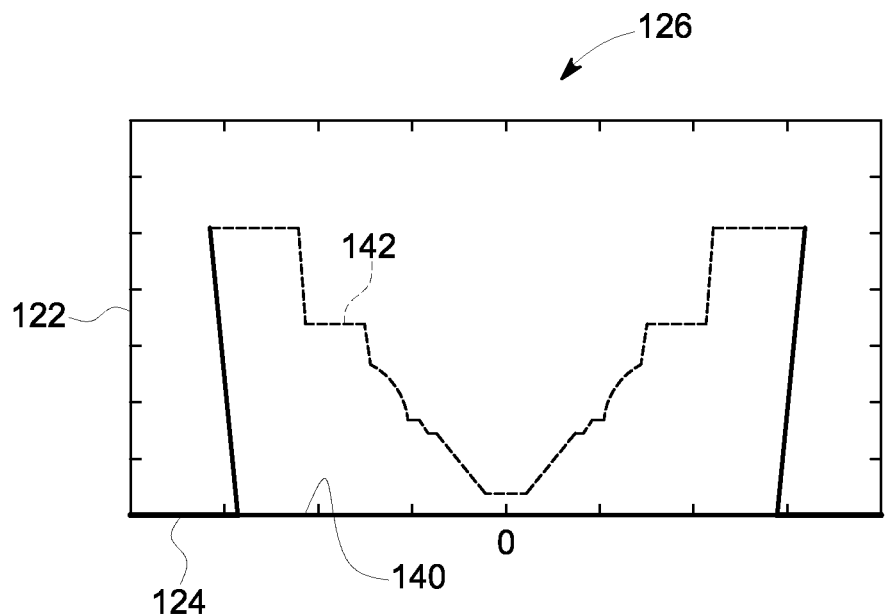
FIG. 5 is a plot of an embodiment of cross-sectional weighting applied by the filter of FIG. 3 to an encode line filled at the end of an echo train as a function of position along the phase encode direction, in accordance with an aspect of the present disclosure.

More specifically, in the plot 120 of FIG. 4, a comparison is provided between weighting applied by the density filter 100 of FIG. 3 (represented by a line 128), which is contrast-optimized, and weighting applied by a conventional signal-optimized density filter (represented by a dotted line 130). As discussed herein, a contrast-optimized filter is intended to denote a filter that weights data to achieve a desired contrast, while a signal-optimized filter denotes a filter that weights data to achieve a desired signal-to-noise ratio. In certain embodiments, enhanced contrast may be achieved at the cost of lower signal-to-noise, while enhanced signal-to-noise may be achieved at the cost of reduced contrast. Accordingly, it should be appreciated that there is a delicate balance between achieving a desired contrast while preserving sufficient signal-to-noise.

Returning to the plot 120 of FIG. 4, as illustrated, the density filter 100 of FIG. 3 applies a relatively high weight to a first and second portion 130, 132 of the blade, which generally corresponds to the first and second weighting regions 104, 106 of the blade either along or proximate the line 116 (FIG. 2). As the line 128 depicts, the density filter 100 reduces weighting of the encode line in a region 134 proximate the center of k-space (denoted in the plot 120 as "0").

As depicted by the line 130, the conventional signal-optimized filter applies a relatively high weight to the very outer region of k-space (e.g., the region of the encode line most radially away from k=0). In particular contrast to the density filter 100, the signal-optimized filter then quickly reduces the applied weighting as the position along the encode line approaches k=0.

As noted above, FIG. 5 represents the weighting applied to an encode line disposed at an outer region of a blade (i.e., away from k=0) by the density filter 100 (represented by a line 140) and the signal-optimized filter (represented by a line 142). As can be appreciated when comparing plot 120 (FIG. 4) and plot 126 (FIG. 5), the density filter 100 drastically reduces the weighting profile along the position 124 when compared to an earlier encode line, while the weighting of the later acquired encode line by the signal-optimized filter is increased. Accordingly, the density filter 100 applies a greater average weighting to data contained within an earlier acquired encode line compared to data contained within a later acquired encode line. In contrast, the signal-optimized filter applies a similar weighting profile between the earlier and later acquired encode lines, with the later encode lines receiving a higher average weighting in certain embodiments.

As set forth above, the embodiment of the density filter 100 depicted in FIG. 3 is merely one embodiment, and many such bow-tie shaped filters are presently contemplated. One density filter design embodiment, for centric encoding, may be defined based on a relationship between the matrix diameter ($d_M$) (or 2× the matrix radius ($r_M$)) and a number of blades (N) and encode lines (L) per blade acquired to satisfy the Nyquist sampling criterion. Such a relationship is provided below with respect to equations (1)-(4). The number of encode lines is expressed as the number of lines L from a central k-space line included per blade to satisfy the Nyquist sampling criterion. Furthermore, to minimize the effective TE of all data points in k-space while satisfying the Nyquist criterion, for each radial distance away from the center of k-space (along the readout direction) only a number of encode lines L will be given the greatest density weighting while the remaining lines outside of L will be given minimal density weighting to minimize their contribution on the final image.

$$LN = d_M(\pi/2) \tag{1}$$

$$L = (d_M/N)(\pi/2) \tag{2}$$

$$L = (1/N)(2r_M)(\pi/2) \tag{3}$$

$$L = r_M \pi/N \tag{4}$$

As discussed above, the density filter designed in accordance with present embodiments may be utilized to obtain a desired contrast in non-Cartesian (e.g., PROPELLER) acquisitions. Accordingly, the filters discussed herein may be implemented in a method in which acquired data is reconstructed so as to correct for motion in accordance with the PROPELLER algorithm. One such method 150 is illustrated as a process flow diagram in FIG. 6. It should be noted that the methods described hereinbelow may be performed using an MRI system, such as system 10 described above with respect to FIG. 1, in conjunction with any suitable processor-based device capable of performing the acts described herein. For example, some or all of the steps of the methods described below may be performed by the control and analysis circuitry 46 or 54 of FIG. 1, and/or by reconstruction hardware located locally or remotely to the system 10. Such acts may be the result of processor-implemented instructions stored on a non-transitory machine-readable medium.

Figure 6:
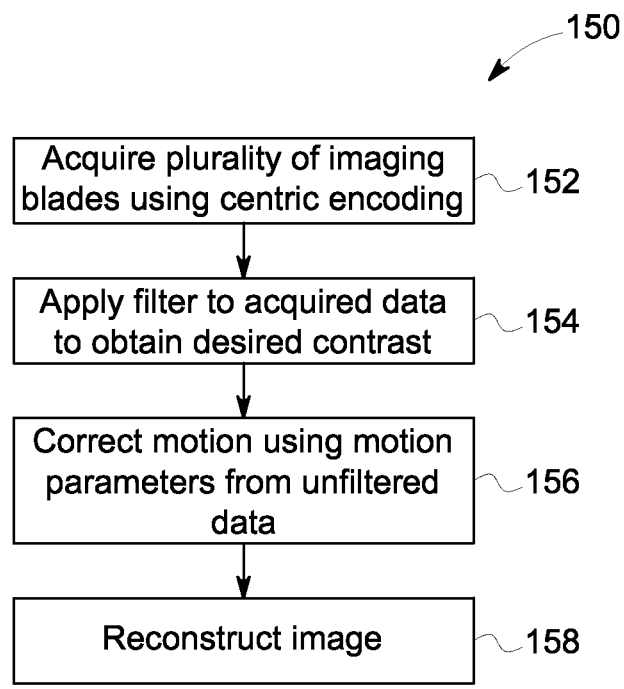
FIG. 6 is a process flow diagram illustrating an embodiment of a method for performing magnetic resonance imaging including motion correction on filtered data using motion correction parameters obtained from unfiltered data, in accordance with an aspect of the present disclosure.

The method 150 depicted in FIG. 6 applies a filter to obtain a desired contrast, while also performing motion correction utilizing data obtained from unfiltered data. The method 150 includes acquiring (block 152) a plurality of imaging blades (i.e., blades utilized for producing a given image). The acts according to block 152 may include performing any non-Cartesian acquisition to obtain the blades, which may have any suitable geometry. As noted above, the acquisitions may be performed using FSE sequences, SE sequences, gradient echo sequences, spoiled gradient echo sequences, or any combination thereof. In addition, techniques such as fluid attenuation are also presently contemplated.

In certain embodiments, the acquisition according to block 152 may also include acquiring less than all data in k-space. For example, in certain embodiments, parallel imaging acquisition may be performed, compressed sensing may be performed, and/or any other suitable accelerated acquisition and reconstruction method may be performed. Thus, in certain embodiments, calibration data for reconstruction may also be acquired. Calibration data may be taken from within each imaging blade, from within only certain imaging blades, from a separately acquired calibration blade (e.g., an oversampled blade acquired before, during, or after the acquisition of block 152), or any combination thereof. In one embodiment, the techniques described herein may be performed in conjunction with those described in U.S. Pat. No. 7,619,410 to Beatty et al. entitled "SYSTEM AND METHOD FOR ACCELERATED MAGNETIC RESONANCE PARALLEL IMAGING," filed on Jun. 8, 2007, which is incorporated herein by reference in its entirety for all purposes.

Therefore, in one embodiment, the acts of block 152 may include acquiring the imaging blades such that each blade has first data points having sampled data and second data points that are missing data (e.g., an undersampled imaging blade). Data may be estimated for the second data points such that each blade may be fully filled using a combination of acquired data and estimated data. In certain embodiments, the data may be estimated using the anti-aliasing partially parallel encoded acquisition reconstruction (APPEAR) algorithm, or using compressed sensing reconstruction algorithms.

Once the desired data has been acquired, a filter is applied (block 154) to the imaging blades to weight data contained therein in any desired manner. Indeed, any filtering method is presently contemplated for block 154, including signal-optimized density filters and contrast-optimized density filters. In one embodiment, the filter may be the density filter 100 of FIG. 3. When the filter is applied according to block 154, the data may be preferentially weighted so as to obtain a desired contrast (or signal-to-noise ratio), as discussed above.

Figure 7:
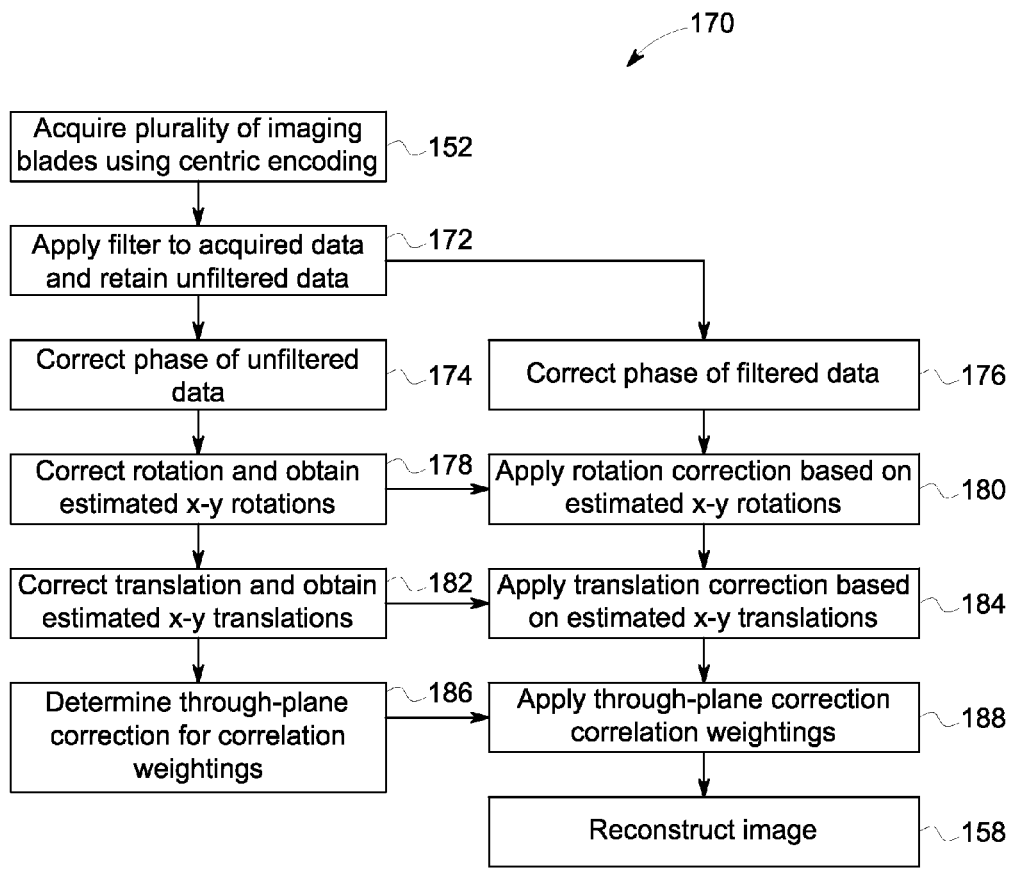
FIG. 7 is a process flow diagram illustrating one embodiment of the manner in which the method of FIG. 6 may be performed, in accordance with an aspect of the present disclosure.

In embodiments where the density filter applied according to block 154 results in a reduction in the effective ETL of the imaging blades, the ETL may not be sufficient to provide for robust motion correction using the PROPELLER algorithm. However, it is now recognized that motion correction parameters obtained from unfiltered data may be utilized for the correction of motion in filtered imaging blades having a reduced ETL. Accordingly, the method 150 includes correcting (block 156) motion of the filtered data using correction parameters obtained from unfiltered data. One embodiment for performing such correction is discussed in detail below with respect to FIG. 7.

After motion is corrected, an image is reconstructed (block 158) using any desired techniques. For example, once the imaging data is corrected for motion, the acts of block 158 may include the application of a fast Fourier transform (FFT).

As noted above, FIG. 7 depicts an embodiment of a method 170 for obtaining motion correction parameters from unfiltered data and using these parameters for correcting motion in filtered data. Accordingly, the method 170 includes, as in the general method 150, acquiring (block 152) a plurality of imaging blades using centric encoding. The method 170 also includes applying (block 172) the density filter (e.g., density filter 100 of FIG. 3) and retaining the unfiltered data for further manipulation. At this point, the depicted method 170 separates into separate parallel steps in which the unfiltered data is manipulated and the filtered data is manipulated. However, it is presently contemplated that certain implementations of method 170 may not perform the acts described herein in the particular order described herein. For example, all of the motion correction parameters may be obtained from the unfiltered data before manipulating the filtered data.

As illustrated, the method 170 includes correcting (blocks 174 and 176) the phase of the unfiltered data and the filtered data. This phase correction may correct k-space shifts and motion phase shifts.

Using, for example the PROPELLER algorithm, the method 170 corrects (block 178) the unfiltered data for x-y rotations. During the acts according to block 178, x-y rotation correction parameters are obtained. For example, an estimated degree of rotation may be obtained. Using these parameters (e.g., estimated rotations), rotation correction is applied (block 180) to the filtered data to obtain rotation-corrected filtered data.

Before, during, or after these acts, x-y translations of the unfiltered data are corrected (block 182), which also produces translational correction parameters, which may be in the form of estimated x-y translations. The filtered data (e.g., the rotation-corrected filtered data) is corrected (block 184) for x-y translations using the estimated x-y translations obtained from correction of the unfiltered data.

Before, during, or after the acts above, through-plane correction for correlation weightings may be determined (block 186). Once such correlation weightings are obtained, and once x-y translations and rotations are corrected for the filtered data in block 184, a through-plane correction correlation weighting may be applied (block 188) to correct for potential z-translations and/or deformations. An image may then be reconstructed from the resulting motion-corrected filtered data according to block 158.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method, comprising:
processing magnetic resonance (MR) data according to a process comprising:
applying a density filter to blades of k-space data rotated about a section of k-space, each blade comprising a first set of encode lines weighted in a first signal weighting and a second set of encode lines weighted in a second signal weighting; and
wherein the density filter is configured to preferentially weight each blade in the first signal weighting to produce blades of weighted k-space data, and wherein the blades comprise centric encoding such that the first set of encode lines correspond to the center of each blade, cross a central region of k-space, and are acquired before the second set of encode lines, and wherein the first signal weighting corresponds to T1-weighting or proton density weighting and the second signal weighting corresponds to T2 and/or T2*-weighting.

2. The method of claim 1, wherein the density filter corresponds to a general shape of the blades and preferentially weights data contained within the first set of encode lines corresponding to a position within a bowtie-shaped region of the filter.

3. The method of claim 2, wherein the bowtie-shaped region comprises a broad section toward an outer region of the density filter that converges toward a central region of the density filter, and the central region of the density filter corresponds to the central region of k-space.

4. The method of claim 1, wherein data within at least a portion of the first set of encode lines is oversampled, and the density filter is applied to the oversampled data.

5. The method of claim 1, wherein each blade has a first width defined by a number of phase encodes before the density filter is applied, wherein the first width is sufficient to enable motion correction, and the density filter causes an effective echo time of the data in each blade to be reduced such that each blade of weighted k-space data has a contrast equal to a blade having a width that is less than the first width.

6. The method of claim 1, comprising:
acquiring the blades of k-space data such that each blade comprises first data points having sampled data and second data points that are missing data; and
estimating data for the second data points such that each blade is fully filled, wherein the estimation is performed using calibration data within the blades, or using calibration data from a separate calibration blade, or a combination thereof.

7. The method of claim 1, comprising correcting the blades of weighted k-space data for motion according to a process comprising:
applying motion correction to the blades of k-space data according to a periodically rotated overlapping parallel lines with enhanced reconstruction (PROPELLER) algorithm to obtain x-y rotation correction parameters, x-y translation correction parameters, and correlation weights;
applying phase correction to the blades of weighted k-space data;
applying x-y rotation correction to the blades of weighted k-space data using the x-y rotation correction parameters obtained from the blades of k-space data;
applying x-y translation correction to the blades of weighted k-space data using the x-y translation correction parameters obtained from the blades of k-space data; and
applying the correlation weights obtained from the blades of k-space data to the blades of weighted k-space data.

8. The method of claim 7, comprising reconstructing the motion-corrected blades of weighted k-space data to generate a motion-corrected T1-weighted or a proton density-weighted image.

9. A method, comprising:
processing magnetic resonance (MR) data according to a process comprising:
applying a filter to blades of k-space data rotated about a section of k-space with respect to one another to produce blades of filtered k-space data, wherein each blade of k-space data comprises a first set of encode lines weighted in a first signal weighting and a second set of encode lines weighted in a second signal weighting, wherein the blades of k-space data comprise centric encoding such that the first set of encode lines correspond to the center of each blade, cross a central region of k-space, and are acquired before the second set of encode lines, and the first signal weighting corresponds to T1-weighting or proton density weighting and the second signal weighting corresponds to T2 and/or T2*-weighting, and the filter preferentially weights each blade in the first signal weighting;
correcting the blades of filtered k-space data for motion; and
wherein correcting the blades of filtered k-space data for motion comprises applying one or more motion correction parameters obtained from performing a motion correction algorithm on the blades of k-space data corresponding to the blades of filtered k-space data.

10. The method of claim 9, wherein applying the motion correction algorithm to the blades of k-space data comprises applying a periodically rotated overlapping parallel lines with enhanced reconstruction (PROPELLER) algorithm to obtain x-y rotation correction parameters, x-y translation correction parameters, and correlation weights.

11. The method of claim 10, wherein correcting the blades of filtered k-space data for motion comprises:
applying phase correction to the blades of filtered k-space data;
applying x-y rotation correction to the blades of filtered k-space data using the x-y rotation correction parameters obtained from the blades of k-space data;
applying x-y translation correction to the blades of filtered k-space data using the x-y translation correction parameters obtained from the blades of k-space data; and
applying the correlation weights obtained for the blades of k-space data to the filtered k-space data.

12. The method of claim 9, wherein the filter corresponds to a general shape of the blades and preferentially weights data contained within the first set of encode lines corresponding to a position within a bowtie-shaped region of the filter.

13. The method of claim 12, wherein each blade of k-space data has a first width defined by a number of phase encodes, wherein the first width is sufficient to enable motion correction, and the filter causes an effective echo time of the data of each blade to be reduced such that each blade of filtered k-space data has a contrast equal to a blade having a width that is less than the first width.

14. The method of claim 9, comprising reconstructing the motion-corrected blades of filtered k-space data to generate a proton density or T1-weighted image.

15. A magnetic resonance imaging (MRI) system, comprising:
- a primary field magnet configured to place gyromagnetic nuclei within a patient into an equilibrium magnetization;
- a plurality of gradient field coils configured to encode positional information into the gyromagnetic nuclei;
- a radiofrequency (RF) transmit coil configured to perturb the gyromagnetic nuclei away from their equilibrium magnetization;
- a plurality of RF receiving coils configured to receive MR signals from the gyromagnetic nuclei as they relax to their equilibrium magnetization;
- control circuitry coupled to the gradient field coils, to the RF transmit coil, and to the plurality of RF receiving coils, wherein the control circuitry is configured to apply control signals to the gradient, RF transmit or receiving coils, or any combination thereof, to acquire blades of k-space data, the blades being rotated about a section of k-space compared to every other blade and each blade comprises a first set of encode lines weighted in a first signal weighting and a second set of encode lines weighted in a second signal weighting; and
- reconstruction circuitry configured to process the blades of k-space data by:
  - applying a filter to the blades of k-space data to preferentially weight each blade in the first signal weighting and thereby produce blades of filtered k-space data; and
  - applying one or more motion correction parameters to the blades of filtered k-space data to correct the blades of filtered k-space data for motion, wherein the one or more motion correction parameters are obtained from performing a motion correction algorithm on the blades of k-space data;
- wherein the blades comprise centric encoding such that the first set of encode lines correspond to the center of each blade, cross a central region of k-space, and are acquired before the second set of encode lines, and wherein the first signal weighting corresponds to T1-weighting or proton density weighting and the second signal weighting corresponds to T2 and/or T2*-weighting.

16. The system of claim 15, wherein the reconstruction circuitry is configured to process the blades of k-space data by applying motion correction to the blades of k-space data according to a periodically rotated overlapping parallel lines with enhanced reconstruction (PROPELLER) algorithm to obtain x-y rotation correction parameters, x-y translation correction parameters, and correlation weighting parameters, and the reconstruction circuitry is configured to process the blades of filtered k-space data by:
- applying phase correction to the blades of filtered k-space data;
- applying x-y rotation correction to the blades of filtered k-space data using the x-y rotation correction parameters obtained from the blades of k-space data;
- applying x-y translation correction to the blades of filtered k-space data using the x-y translation correction parameters obtained from the blades of k-space data; and
- applying correlation weights obtained from the blades of k-space data to the blades of filtered k-space data.

* * * * *